United States Patent [19]
Paserin et al.

[11] Patent Number: 5,145,716
[45] Date of Patent: Sep. 8, 1992

[54] INFRARED WINDOW

[75] Inventors: Vladimiri Paserin; Juraj Babjak; Victor A. Ettel, all of Mississauga; Richard S. Adams, Burlington, all of Canada

[73] Assignee: Inco Limited, Toronto, Canada

[21] Appl. No.: 560,859

[22] Filed: Jul. 27, 1990

[30] Foreign Application Priority Data

Oct. 19, 1989 [CA] Canada .................. 2001009

[51] Int. Cl.⁵ .................. B05D 3/06; C23C 16/00; G02B 26/02; B05B 5/00
[52] U.S. Cl. .................. 427/55; 427/252; 427/124; 118/725; 118/50.1; 118/641; 359/350; 359/894
[58] Field of Search ............ 427/55, 56.1, 250, 252, 427/123, 124, 125; 118/724, 725, 50.1, 641; 350/267

[56] References Cited

U.S. PATENT DOCUMENTS

| | | | |
|---|---|---|---|
| 2,649,754 | 8/1953 | Davis et al. | 118/49 |
| 2,867,552 | 1/1959 | Homer | 117/217 |
| 3,213,827 | 10/1965 | Jenkin | 118/49.5 |
| 3,900,646 | 8/1975 | Clyde | 427/55 |
| 4,312,794 | 1/1982 | Pearce et al. | 252/578 |
| 4,431,257 | 2/1984 | Born | 350/610 |
| 4,550,684 | 11/1985 | Mahawili | 118/641 |
| 4,570,043 | 2/1986 | Lloyd et al. | 252/570 |
| 4,749,950 | 7/1988 | Stevens | 427/55 |
| 4,766,665 | 8/1988 | McKernan et al. | 408/1 R |

FOREIGN PATENT DOCUMENTS 84-305062.6 7/1984 European Pat. Off. .

*Primary Examiner*—Marianne Padgett
*Attorney, Agent, or Firm*—Blake T. Biederman; Francis J. Mulligan, Jr.

[57] ABSTRACT

The invention provides an apparatus for metal plating a substrate. The apparatus includes a chamber adapted to receive metal carbonyl gas. The chamber includes an infrared transparent window. The infrared transparent window has a cooling passage filled with liquid coolant. The liquid coolant has a temperature below which decomposition of the metal carbonyl gas occurs. The liquid coolant prevents decomposition of the metal carbonyl gas on the infrared transparent window. The liquid coolant also is substantially infrared transparent for allowing infrared radiation through the infrared transparent window and cooling passage into the chamber. An infrared radiation source sends infrared radiation into the chamber through the infrared transparent window and cooling passage to heat the substrate to a temperature at which decomposition of the metal carbonyl gas occurs.

14 Claims, 3 Drawing Sheets

INFRARED WINDOW

This invention relates to infrared transparent windows. More particularly, this invention relates to infrared windows which allow infrared radiation into a chemical vapor deposition chamber to heat substrates within the chamber.

BACKGROUND OF THE ART AND PROBLEM

Chemical vapor deposition by thermal decomposition of a metal carbonyl has long been a known method of plating substrates. A substrate within a chamber containing a metal carbonyl gas is heated to a temperature above the decomposition temperature of the metal carbonyl gas. The metal carbonyl gas decomposes, coating the substrate with a metal coating, such as a nickel coating from decomposed nickel carbonyl gas. Useful metals which may be deposited from the metallic carbonyl compounds are nickel, iron, chromium, molybdenum, tungsten, cobalt, tellurium, rhenium, and the like.

Methods of heating a substrate in chemical vapor deposition chambers include induction, electrical resistance, and infrared heating. Infrared heating is required when the substrate to be heated is not electrically conductive, such as polyurethane. Infrared heating is directed into the chamber through infrared transparent windows to heat the substrate. Preferably, infrared heating selectively heats the substrate within the chamber, not the metal carbonyl gas or the infrared transparent window. If the metal carbonyl gas is heated above its decomposition temperature, it spontaneously decomposes. Similarly, if the infrared transparent window is heated above the decomposition temperature of the metal carbonyl gas, the gaseous compound decomposes on the infrared transparent window. This situation is referred to as "fogging" of the window. Fogging of the window results in a stoppage of carbonyl plating of substrates because the radiation can not effectively penetrate the fogged windows. To solve this problem, the windows must be removed to be cleaned or replaced.

One source of this problem is that infrared transparent windows constructed of materials such as borosilicate glass, clear fused quartz, polyethylene, terephtalate, polytetrafluoroethylene, polytetrafluoroethylene-propylene and other materials are not perfectly infrared transparent. Therefore, infrared transparent windows are heated by the absorption of infrared radiation, whereby windows may be heated to temperatures at which decomposition of metal carbonyl gas occurs. Metal carbonyl gas decomposes on the overheated windows fogging the windows. Once fogging occurs, the deposition process rapidly accelerates. Fogging accelerates because, the metal product of the carbonyl gas also is not completely infrared transparent which causes increased infrared heating of the windows.

Jenkin, in U.S. Pat. No. 3,213,827 describes an air cooled cooling duct for cooling an infrared transparent chamber wall. However, due to the inefficiencies of air cooling, it is believed that the design of Jenkin is insufficient to effectively prevent fogging.

It is an object of this invention to effectively prevent fogging of infrared windows in carbonyl decomposition chambers.

It is another object of this invention to effectively prevent fogging with a minimal loss of operating efficiency.

SUMMARY OF THE INVENTION

The invention provides an apparatus for metal plating a substrate. The apparatus includes a chamber adapted to receive metal carbonyl gas. The chamber includes an infrared transparent window. The infrared transparent window has a cooling passage filled with liquid coolant. The liquid coolant has a temperature below which decomposition of the metal carbonyl gas occurs. The liquid coolant prevents decomposition of the metal carbonyl gas on the infrared transparent window. The liquid coolant also is substantially infrared transparent for allowing infrared radiation through the infrared transparent window and cooling passage into the chamber. An infrared radiation source sends infrared radiation into the chamber through the infrared transparent window and cooling passage to heat the substrate to a temperature at which decomposition of the metal carbonyl gas occurs.

The method of decomposing metal carbonyl gas onto a substrate involves introducing the substrate into a chamber. Infrared radiation is sent through the infrared transparent window and the cooling passage of the infrared transparent window to heat the substrate to a temperature at which decomposition of metal gas occurs. The infrared transparent window is cooled with a liquid coolant inside of said cooling passage to prevent decomposition of carbonyl gas on said infrared transparent window. The liquid is substantially transparent to infrared radiation to allow infrared radiation through said cooling passage to heat the substrate. Finally, the liquid coolant is maintained at a temperature below which the metal carbonyl gas decomposes to assure effective cooling of the transparent window. dr

DESCRIPTION OF PREFERRED EMBODIMENT

Figure 1:
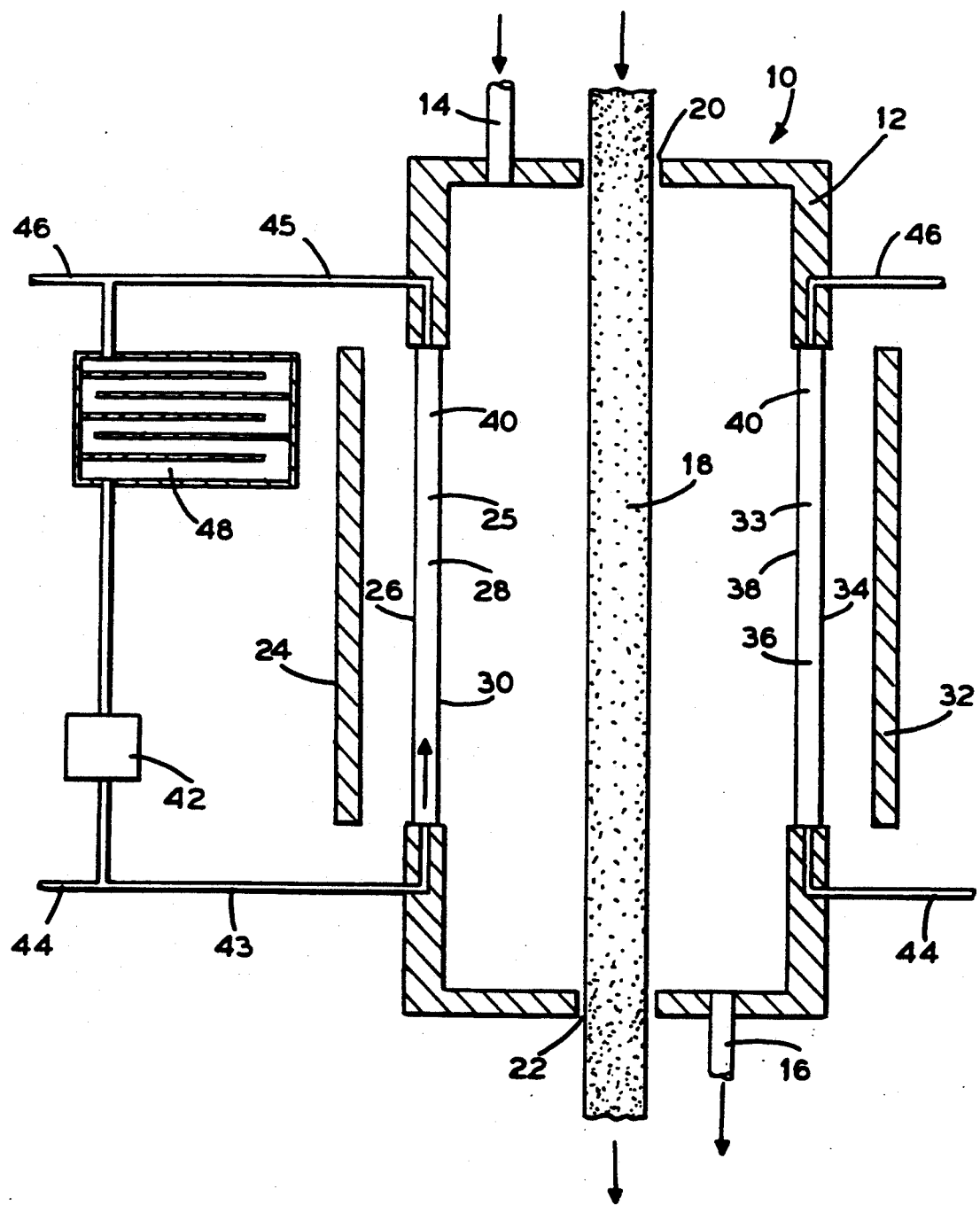
FIG. 1 is a schematic cross sectional view of the apparatus of the invention, illustrating cooling passages through infrared transparent windows.

Referring to FIG. 1, the apparatus 10 is constructed of chamber 12 having chamber inlet 14 and outlet 16. Metal carbonyl gas enters chamber 12 wherein the carbonyl gas decomposes upon heated substrate 18 to metal plate substrate 18. Exhaust gases are removed through exit 16. A substrate 18 such as a polyurethane foam, tow of fibers or fabric made of glass, carbon or polymeric fibers continuously passes through chamber 12 entering substrate inlet 20 and exiting substrate exit 22 (in the illustrated embodiment of the invention). Alternatively, the invention may be utilized for batch-type operations.

The substrate is heated with infrared sources 24 and 32. Infrared source 24 emits radiation through infrared transparent window 25. Infrared transparent window 25 is constructed of outer sheet 26, cooling passage 28 and inner sheet 30. Similarly, infrared source 32 emits radiation through infrared transparent window 33. Infrared transparent window 33 is constructed of outer sheet 34, cooling passage 36 and inner sheet 38. It is preferred that the sheets 26, 30, 34 and 38 be constructed of a stable glass or a rigid plastic. Suitable window materials include, for example: glass sold under the trademark PYREX or VYCOR, quartz, and rigid plastics having a high infrared transparency and a softening point of about 150° C. or greater.

Cooling passages 28 and 36 are preferably defined by the space between the sheets 26 and 30 and sheets 34 and 38 respectively. However, it is recognized that cooling passages 28 and 36 could have different shapes depending upon the design of windows 25 and 33. Liquid coolant 40 cools sheets 30 and 38 to prevent metal carbonyl gas from decomposing onto the sheets 30 and 38. Liquid coolants are defined as all liquids which may be used to cool transparent windows and which allow sufficient penetration of infrared radiation into a chamber to heat a substrate above or equal to the decomposition temperature of metal carbonyl gas within the chamber. Liquid coolant 40 is substantially infrared transparent for allowing infrared radiation through said window and said cooling passage into said chamber.

When metal decomposes onto sheets 30 and 38 the sheets become fogged with metal. When this occurs, the metal deposited on sheets 30 and 38 is further heated, accelerating deposition of metal. At this point, plating of metal substrate is no longer possible, as metal deposited on sheets 30 and 38 effectively blocks the infrared heating of substrate 18. Fogging of windows 25 and 33 becomes a greater problem as the temperature of the metal carbonyl gas in chamber 12 approaches its decomposition temperature. However, the apparatus and method of the invention effectively prevent fogging of windows 25 and 33 when the metal carbonyl gas is near its decomposition temperature.

Liquid coolant 40 must be maintained at a temperature below the decomposition temperature of the metal carbonyl gas to effectively cool sheets 30 and 38. Pump 42 forces cooling liquid through conduits 43 and 44 into cooling passages 28 and 36. The infrared transparent liquid then flows through conduits 45 and 46 into radiator 48. Radiator 48 is used to maintain liquid coolant 40 at a temperature which effectively prevents fogging of sheets 30 and 38. Radiator 48 may be cooled by air, water, ice water or any other cooling means.

The selection of liquid coolant 40 is essential to the operation of apparatus 10. If the liquid absorbs too much infrared energy, substrate 18 will not be heated to a sufficient temperature and decomposition of carbonyl gas will not occur. Also, absorption of infrared energy by liquid coolant 40 reduces plating efficiency increasing operating costs. Table 1 below contains a list of liquid coolants which are predicted to have the necessary transparency to infrared radiation and sufficient heat capacity to cool sheets 30 and 38.

TABLE 1

| GROUP NAME | REQUIRED NUMBER OF ATOMS* |
|---|---|
| Alkanes | ≧10-11 Carbon |
| Alkenes | ≧10-11 Carbon |
| Alkynes | ≧10-11 Carbon |
| Aromatics | ≧10 Carbon |
| Alcohols | ≧3 Carbon + Oxygen |
| Ethers | ≧10-11 Carbon + Oxygen |
| Carboxyl acids | ≧3 Carbon + Oxygen |
| Carboxylic acids | 3, 10 or 11 Carbon + Oxygen |
| Esters | ≧7 or 8 Carbon + Oxygen |
| Ketones | ≧7 or 8 Carbon + Oxygen |
| Anhydrides | ≧7 or 8 Carbon + Oxygen |
| Amides | 3 Carbon + Oxygen + Nitrogen |

TABLE 1-continued

| GROUP NAME | REQUIRED NUMBER OF ATOMS* |
|---|---|
| Amines | ≧Carbon + Nitrogen |

*Lower for halogen substituted compounds

The number of atoms present should also be limited, so compounds are liquid at room temperature. Silicon based liquids, such as Dow Corning's product DOW CORNING 200 FLUID are also effective. Although, some compounds that are solid at room temperature would also operate if they were maintained at great enough temperature to be liquid and at a low enough temperature to effectively cool sheets 30 and 38. It is preferred that the liquid coolants selected have a viscosity below 10 cP and a boiling point above 100° C. for effective cooling.

Figure 2:
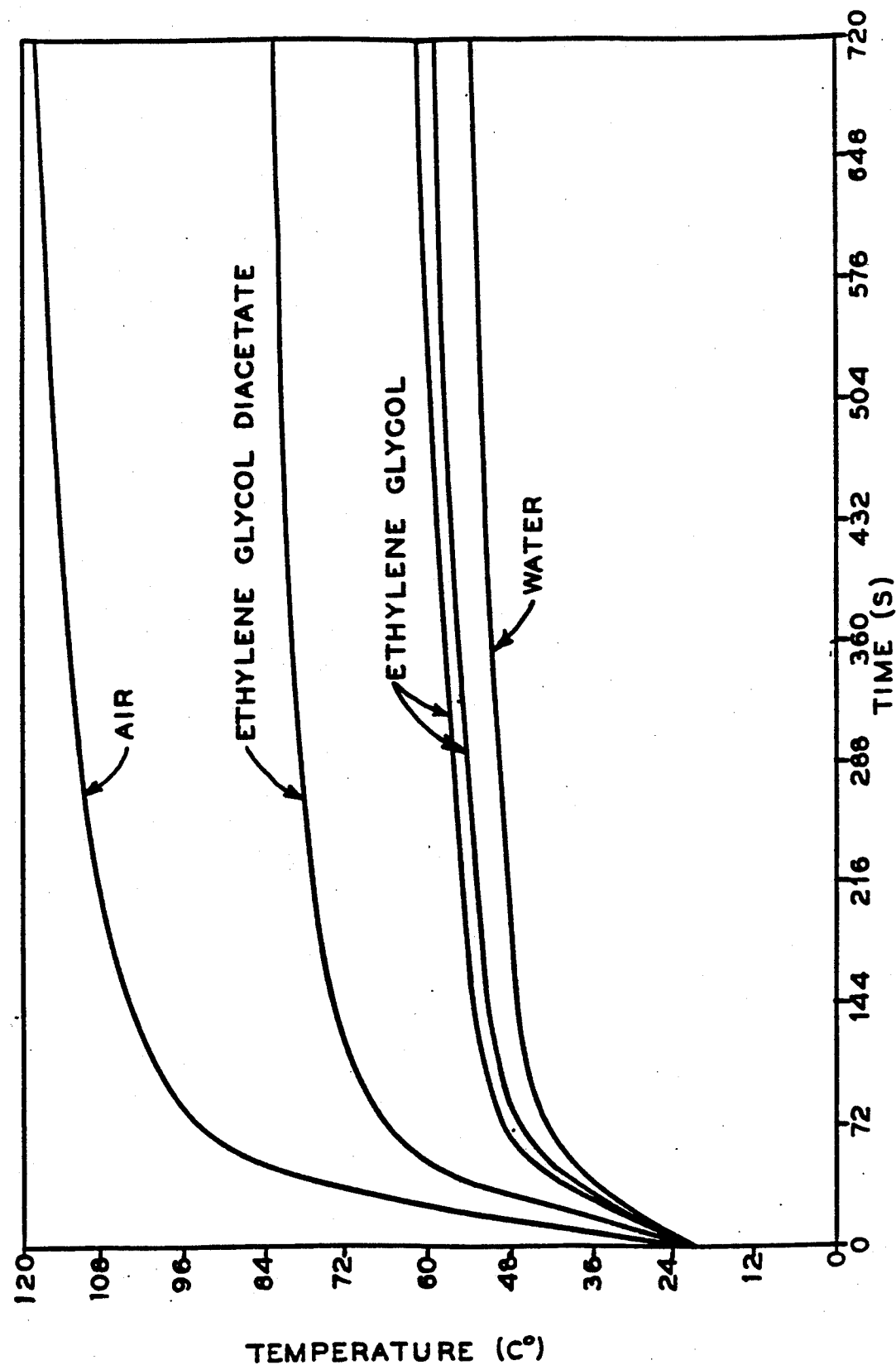
FIG. 2 is a plot of temperature versus time for infrared heating of polyurethane foam comparing different infrared transparent liquids using infrared transparent sheets spaced 4 mm apart.
Figure 3:
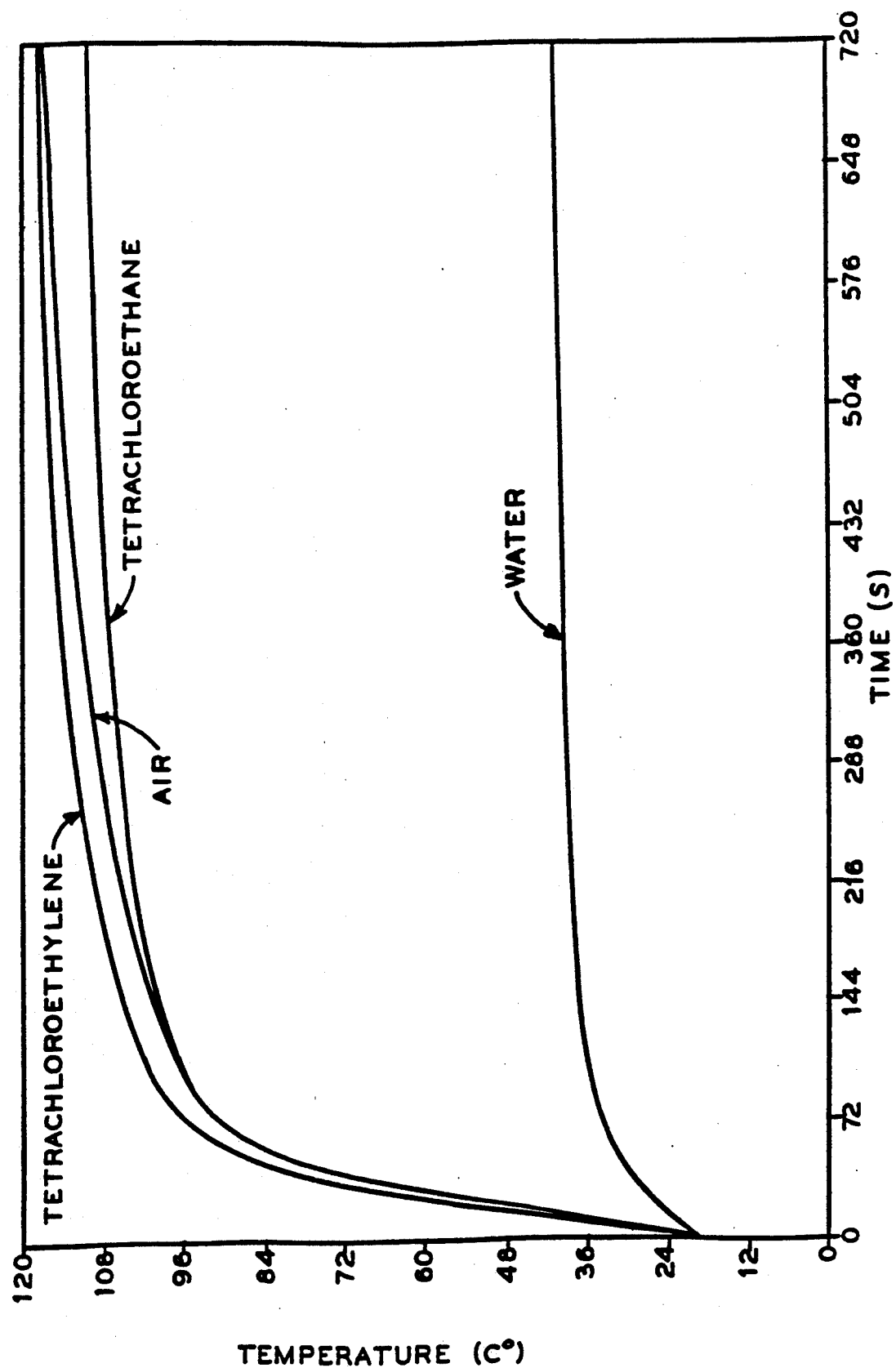
FIG. 3 is a plot of temperature versus time for infrared heating of polyurethane foam comparing different infrared transparent liquids using infrared transparent sheets spaced 5 mm apart.

Referring to FIGS. 2 and 3, several infrared transparent liquids were tested. The laboratory test setup utilized windows having two infrared transparent glass sheets sold under the trademark PYREX spaced 6 mm apart. The space between the PYREX sheets was filled with various fluids. The test of FIG. 2 utilized PYREX sheets 4 mm in thickness and the test of FIG. 3 utilized PYREX sheets of 5 mm in thickness. Spaced adjacent on one side of the PYREX sheets and test fluid was a 140 volt, 440 watt infrared lamp. The filament of the infrared lamp was heated to a temperature of 1980° K., having a peak wavelength of 1.46 um. Spaced on the opposite side of the windows and test fluid was a polyurethane foam substrate. Within the polyurethane foam was a thermocouple used to measure heating of the polyurethane foam.

The degree of liquid coolant infrared transmittance increased from lowest to highest transmittance in the following order: water, ethylene glycol, ethylene glycol diacetate, tetrachlorethane and tetrachloroethylene. The test indicated that tetrachloroethylene and air allowed approximately equal infrared radiation to pass. However, due to air's low density, air is not an effective coolant. Tetrachloroethylene has proven to be an effective coolant. Tetrachloroethylene has a heat capacity at 20° C. of about 0.904 J/g ° C. The coolant used should be a liquid with sufficient heat capacity and sufficient transparency to infrared radiation. The heat capacity at 20° C. is preferably above about 0.4 J/g ° C. and most preferably above about 0.9 J/g ° C. The heat capacity of air at 20° C. is actually slightly greater than that of tetrachlorethylene at 20° C. having a heat capacity of about 1.00 J/g ° C. However, the density of tetrachlorethylene is more than three orders of magnitude greater than that of air. Tetrachloroethylene has a density of about 1.623g/cm at 20° C. whereas air has a density of only about 0.00122 g/cm$^3$ at 20° C. This greater density greatly improves heat transfer, causing the infrared transparent liquid coolants of the invention to be superior to air cooled methods. Cooling with the infrared liquid coolants of the invention facilitates effective prevention of window fogging.

Optionally, a substantially pure source or supply of carbon monoxide may be supplied through a valve to the chamber when metal deposits upon inside walls of windows within a chamber from carbonyl deposition. For example, to remove deposited nickel, the infrared source is temporarily reduced and carbon monoxide fills the chamber. Inside the chamber the following reverse reaction removes nickel from the windows:

$$Ni + 4CO \rightarrow Ni(CO)_4$$

However, with the correct application of the invention, it is not necessary to use the reverse reaction. The apparatus and method of the invention have eliminated the requirement of periodic cleaning of infrared transparent windows of carbonyl chambers heated by infrared radiation.

While in accordance with the provisions of the statute, there is illustrated and described herein specific embodiments of the invention. Those skilled in the art will understand that changes may be made in the form of the invention covered by the claims and the certain features of the invention may sometimes by used to advantage without a corresponding use of the other features.

The embodiments of the invention in which an exclusive property or privilege is claimed are defined as follows:

1. An apparatus for metal plating substrate comprising:
    a chamber containing the substrate and adapted to receive a metal carbonyl gas, said chamber including an infrared transparent window, said infrared transparent window having a cooling passage filled with liquid coolant selected from the group consisting of tetrachloroethane and tetrachloroethylene, said liquid coolant having a temperature below which decomposition of said metal carbonyl gas occurs for cooling said window to prevent decomposition of said metal carbonyl gas on said infrared transparent window, and said liquid coolant being substantially infrared transparent for allowing infrared radiation through said infrared transparent window and cooling passage into said chamber for radiant heating of said substrate; and
    an infrared radiation source for projecting infrared radiation into said chamber through said infrared transparent window to heat the substrate within said chamber to a temperature at which decomposition of said metal carbonyl gas occurs on the surface of said substrate.

2. The apparatus of claim 1 wherein said infrared transparent window includes two parallel spaced sheets and said cooling passage is defined by the space within said sheets.

3. The apparatus of claim 1 additionally including a pump connected to said cooling passage for supplying said liquid coolant to said cooling passage.

4. The apparatus of claim 2 wherein said infrared transparent window is constructed from the group consisting of glass, quartz and rigid plastics.

5. The apparatus of claim 1 additionally including a radiator connected to said cooling passage for cooling said liquid coolant.

6. The apparatus of claim 1 additionally including a carbon monoxide gas supply and a valve connecting said carbon monoxide supply to said chamber for periodic removal of any metal deposited on said infrared transparent window.

7. The apparatus of claim 1 wherein said liquid coolant has a heat capacity at 20° C. above about 0.4 J/g ° C.

8. A method of decomposing metal carbonyl gas onto a substrate comprising:
    introducing the substrate into a chamber, said chamber containing the metal carbonyl gas and having an infrared transparent window to allow infrared radiation into said chamber to heat the substrate, and said infrared transparent window having a cooling passage,
    sending infrared radiation through said infrared transparent window an said cooling passage of said infrared transparent window to heat the substrate to a temperature at which decomposition of the metal carbonyl gas occurs,
    cooling said infrared transparent window with a liquid coolant selected from the group consisting of tetrachloroethane and tetrachloroethylene inside of said cooling passage to prevent decomposition of carbonyl gas on said infrared transparent window, said liquid coolant being substantially transparent to infrared radiation to allow infrared radiation through said cooling passage to heat the substrate, and
    maintaining said liquid coolant at a temperature below which the metal carbonyl gas decomposes.

9. The method of claim 8 including that step of cleaning metals from said infrared transparent window by directing substantially pure carbon monoxide to said infrared transparent window to remove said metal from said window as metal carbonyl gas.

10. The method of claim 8 additionally including the step of pumping said liquid coolant through said cooling passage.

11. The method of claim 8 wherein said infrared transparent window includes two parallel spaced sheets and said cooling passage is defined by the space within said sheets.

12. The apparatus of claim 11 wherein said infrared transparent window is selected from the group consisting of glass, quartz and rigid plastics.

13. The method of claim 8 additionally including the step of cooling said liquid coolant with a radiator.

14. The method of claim 8 wherein said liquid coolant has a heat capacity at 20° C. above about 0.4 J/g ° C.

* * * * *